United States Patent
Zamel

[19]

[11] Patent Number: 5,900,967
[45] Date of Patent: May 4, 1999

[54] LASER DIODE MOUNTING TECHNIQUE TO EVENLY DEPOSIT ENERGY

[75] Inventor: James M. Zamel, Hermosa Beach, Calif.

[73] Assignee: TRW Inc., Redondo Beach, Calif.

[21] Appl. No.: 08/766,434

[22] Filed: Dec. 12, 1996

[51] Int. Cl.[6] ................. H01S 3/04; H01S 3/91
[52] U.S. Cl. .......... 359/337; 359/343; 359/345; 372/70
[58] Field of Search ................... 359/337, 343, 359/345; 372/33, 34, 40, 70, 71

[56] References Cited

U.S. PATENT DOCUMENTS

| | | |
|---|---|---|
| 3,423,693 | 1/1969 | Chernoch et al. . |
| 3,534,291 | 10/1970 | Martin et al. . |
| 3,633,126 | 1/1972 | Martin et al. . |
| 4,039,962 | 8/1977 | Hughes .................................... 359/337 |
| 4,127,827 | 11/1978 | Barry . |
| 4,132,955 | 1/1979 | Hughes .................................... 359/337 |
| 4,233,571 | 11/1980 | Wang et al. . |
| 4,321,551 | 3/1982 | Bleil et al. .............................. 359/345 |
| 4,378,601 | 3/1983 | Eggleston et al. . |
| 4,408,334 | 10/1983 | Lundstrom . |
| 4,493,085 | 1/1985 | Valley . |
| 4,555,786 | 11/1985 | Byer . |
| 4,682,340 | 7/1987 | Dave et al. . |
| 4,709,368 | 11/1987 | Fukuda . |
| 4,725,787 | 2/1988 | Chandra . |
| 4,730,324 | 3/1988 | Azad . |
| 4,734,911 | 3/1988 | Bruesselbach . |
| 4,794,344 | 12/1988 | Johnson . |
| 4,833,682 | 5/1989 | Byer . |
| 4,852,109 | 7/1989 | Kuchar . |
| 4,875,219 | 10/1989 | Russell . |
| 4,902,980 | 2/1990 | O'Meara . |
| 4,918,703 | 4/1990 | Kukla . |
| 4,949,346 | 8/1990 | Kuper et al. . |
| 4,984,246 | 1/1991 | Cabaret et al. . |
| 4,989,216 | 1/1991 | Chandra et al. . |
| 4,991,177 | 2/1991 | Chang et al. . |
| 5,033,058 | 7/1991 | Cabaret et al. ........................... 372/70 |
| 5,034,627 | 7/1991 | Ayral et al. . |
| 5,034,950 | 7/1991 | Jackel et al. . |
| 5,050,175 | 9/1991 | Ayral et al. . |
| 5,170,406 | 12/1992 | Tidwell .................................... 372/71 |
| 5,228,051 | 7/1993 | Matthews . |
| 5,271,031 | 12/1993 | Baer . |
| 5,305,345 | 4/1994 | Albrecht et al. . |
| 5,317,585 | 5/1994 | Gregor . |
| 5,335,237 | 8/1994 | Zapata . |
| 5,351,251 | 9/1994 | Hodgson .................................... 372/4 |
| 5,521,932 | 5/1996 | Marshall .................................. 372/75 |
| 5,555,254 | 9/1996 | Injeyan et al. . |
| 5,646,773 | 7/1997 | Injeyan et al. ......................... 359/337 |
| 5,651,021 | 7/1997 | Richard et al. .......................... 372/69 |

Primary Examiner—Nelson Moskowitz
Attorney, Agent, or Firm—Michael S. Yatsko

[57] ABSTRACT

An optical amplifier for a high power, solid state laser which includes a slab of a solid state laser material, for example, yttrium-aluminum-garnet (YAG) crystal. One or more diode arrays may be vertically stacked and configured to provide generally uniform energy distribution in the crystal in a vertical direction. By maintaining a relatively uniform energy distribution in the crystal in a vertical direction, thermal and stress aberrations of the resulting laser beam are minimized.

10 Claims, 3 Drawing Sheets

LASER DIODE MOUNTING TECHNIQUE TO EVENLY DEPOSIT ENERGY

BACKGROUND OF THE INVENTION

1. Field of the Invention

The present invention relates to an optical amplifier for a high power, solid state laser and, more particularly, to an optical amplifier which includes a slab of solid state lasing material, for example, yttrium-aluminum-garnet (YAG) crystal, and one or more diode arrays for exciting the solid state lasing material to a relatively high energy metastable state, wherein the diode arrays are mounted to provide a relatively uniform energy deposition onto the solid state lasing material in a vertical direction in order to reduce non-uniform thermal heating of the crystal to reduce thermal and stress aberrations of the output laser beam.

2. Description of the Prior Art

Solid state lasers are known to include an optical amplifier, for example, a so-called zig-zag amplifier, which, in turn, includes a generally rectangular slab of lasing material, such as yttrium-aluminum-garnet (YAG) crystal. Examples of such solid state lasers are disclosed in U.S. Pat. Nos.: 4,730,324; 4,852,109; and 5,305,345. In such lasers, the atoms in the lasing material are pumped into a relatively high energy metastable state.

Various methods are known for pumping. For example, diode arrays are known to be used in such applications. Lasers which utilize diode arrays for pumping are disclosed in U.S. Pat. Nos.: 4,852,109; 4,949,346; 4,984,246; 5,271,031; 5,305,345; 5,317,585; and 5,351,251. In order to improve performance of the laser, the light energy from the diode arrays must be relatively uniform in the vertical direction of the lasing material in order to reduce thermal and stress aberrations of the resulting laser beam. In such lasers, the light is zig-zagged in a horizontal direction to average out thermal aberrations.

In many known applications, the diode arrays are mounted one on top of another, leaving energy gaps in the lasing material defining unpumped zones 10 in which no light is directed onto the lasing material, as illustrated in FIG. 1. Such a configuration produces a non-uniform deposition of energy in the vertical direction of the lasing material. As discussed above, non-uniform energy deposition results in non-uniform thermal heating of the crystal, resulting in thermal and stress aberrations of the laser beam. More particularly, pumping of the atoms within the lasing material produces considerable heat therewithin in the areas where the atoms of the lasing material are pumped. Since the materials used for many known lasing materials are relatively poor thermal conductors, the non-pumped zones 10 in the lasing material, as illustrated in FIG. 1, cause thermal gradients in the lasing material in the vertical direction.

Various methods are known for minimizing thermal gradients in a lasing material, for example, as disclosed in U.S. Pat. Nos. 4,852,109 and 4,949,346. The '109 patent includes a slab of lasing material formed with a pair of side rails disposed on opposing lateral surfaces of the lasing material. The side rails include a conduit connected to a fluid control system which enables the volumetric flow rate through the conduit within the side rail to be varied which, in turn, allows the temperature of the lateral surfaces to be adjusted. The lateral surfaces of the lasing material are generally parallel to a longitudinal axis of the slab and generally perpendicular to the surfaces subject to energy pumping by diode arrays.

The '346 patent discloses heat sinks bonded to opposing pump faces of the slab of lasing material. In particular, a transparent, thermally conductive heat sink is bonded to the opposing faces of the lasing material, that are subject to the pumping action of the diode arrays.

The configurations disclosed in the '109 and '346 patents attempt to minimize the thermal gradient between the outer surface of the lasing material relative to internal portions. While the above-disclosed methods provide adequate performance in minimizing the effects of the thermal gradient caused between the outer surface of the lasing material and an inner surface, the disclosed methods do not provide compensation for thermal gradients resulting from non-uniform distribution of the energy from the pumping action from the diode arrays, as illustrated in FIG. 1. In order to resolve this problem, U.S. Pat. No. 5,555,254. issued on Sep. 10, 1996 to the same assignee as the assignee of the present invention discloses. A pair of lenses 12 and 14, as illustrated in FIG. 2, disposed between the diode arrays and the crystal. As shown in FIG. 2, the lenses 12 and 14 bend the light rays from the diode arrays to fill in the unpumped zones in the vertical direction of the lasing material. Although such a configuration provides good performance in reducing thermal gradients in the lasing material in the vertical direction, such a configuration is relatively complex and expensive to manufacture. In particular, such lenses are formed by sapphire material, which is relatively expensive.

SUMMARY OF THE INVENTION

It is an object of the present invention to solve various problems in the prior art.

It is yet another object of the present invention to provide an optical amplifier for a solid state laser which includes uniform energy distribution in a vertical direction of the lasing material without the need for expensive materials, such as sapphire.

It is yet another object of the present invention to provide an optical amplifier for a solid state laser which includes a slab of lasing material, such as yttrium-aluminum-garnet (YAG) crystal and a plurality of diode arrays for exciting the atoms within the lasing material to a relatively high energy metastable state, wherein the diode arrays are configured to provide uniform energy distribution in the YAG crystal in a vertical direction.

Briefly, the present invention relates to an optical amplifier, for example a zig-zag amplifier, for a high power, solid state laser which includes a slab of a solid state laser material, for example, yttrium-aluminum-garnet (YAG) crystal. A plurality of diode arrays are vertically stacked and configured to provide generally uniform energy distribution in the crystal in a vertical direction. By maintaining a relatively uniform energy distribution in the crystal in a vertical direction, thermal and stress aberrations of the resulting laser beam are minimized.

BRIEF DESCRIPTION OF THE DRAWING

These and other objects of the present invention will be readily understood with reference to the following specification and attached drawing, wherein.

DETAILED DESCRIPTION OF THE INVENTION

Figure 1:
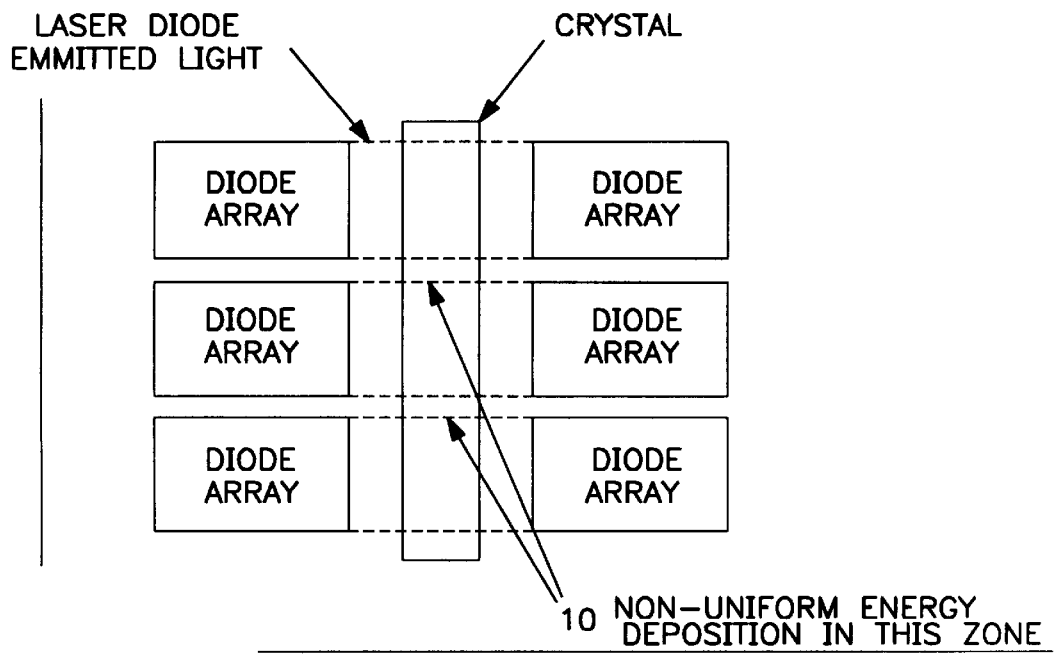
FIG. 1 is a simplified illustration of a known optical amplifier which includes a lasing material and a plurality of vertically stacked diode arrays defining non-pumped regions therebetween.
Figure 2:
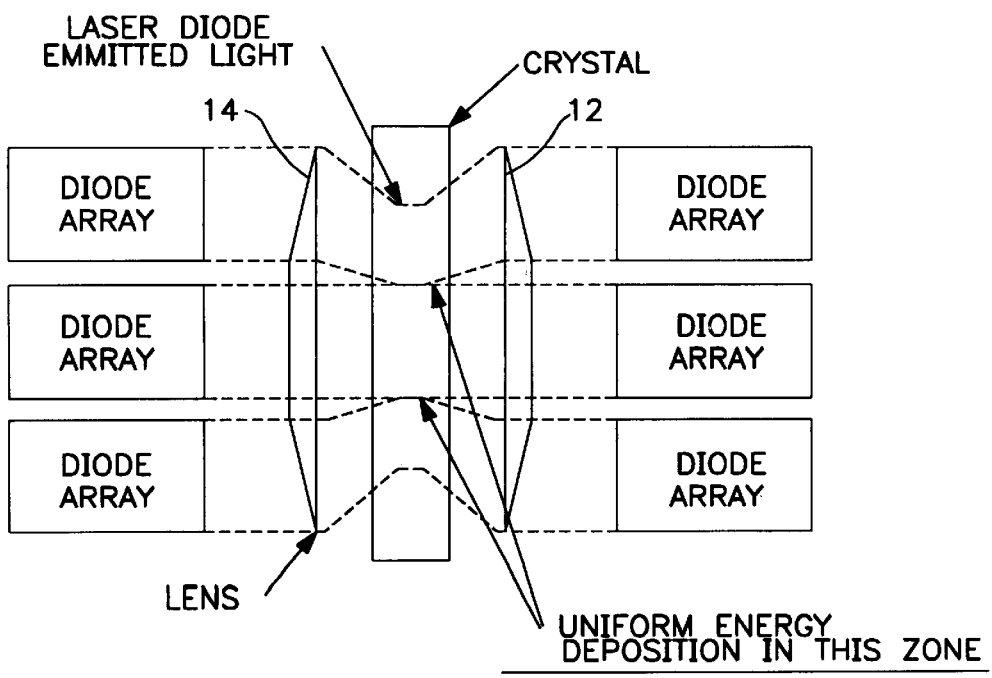
FIG. 2 is an illustration of another known optical amplifier which includes a crystal and a plurality of vertically stacked diode arrays, along with a pair of lenses disposed between the diode arrays and the crystal to provide a relatively uniform energy distribution in the crystal in a vertical direction.

The present invention relates to an optical amplifier for a solid state laser and, more particularly, to an optical amplifier for a solid state laser which includes a slab of lasing material 20 (FIG. 3), such as an yttrium-aluminum-garnet (YAG) crystal, and a plurality of diode arrays, for example, 22, 24, 26, 28, 30 and 32. An important aspect of the invention is that the diode arrays 22, 24, 26, 28, 30 and 32 are configured to provide relatively uniform energy distribution in the crystal 20 in a vertical direction relatively simply and economically without the need for lenses as discussed above.

It should be understood by those of ordinary skill in the art that the principles of the present invention are applicable to virtually any type of pumping device, such as the diode arrays. The principles of the present invention are also applicable to any number of diode arrays. It is only important that the energy distribution in the crystal 20 in a vertical direction be relatively uniform. For illustration, the invention is described and illustrated further with the six diode arrays, 22, 24, 26, 28, 30 and 32.

The crystal 20 is formed as an elongated lasing material with a predetermined geometry, for example, a generally rectangular cross-section, as shown, defining a major vertical axis 34 and a minor transverse axis 36. As shown, the plurality of diode arrays 22, 24, 26, 28, 30 and 32 are disposed adjacent a pair of oppositely disposed lateral pumping surfaces 38 and 40 of the crystal 20. As discussed above, the diode arrays 22, 24, 26, 28, 30 and 32 are used to excite the atoms within the crystal 20 to a relatively high energy metastable state. In order to reduce aberrations resulting from thermal stress and strain of the crystal 20, the diode arrays 22, 24, 26, 28, 30 and 32 are configured to provide relatively uniform energy distribution in a vertical direction of the crystal 20 as shown in FIG. 3.

Figures 5, 6:
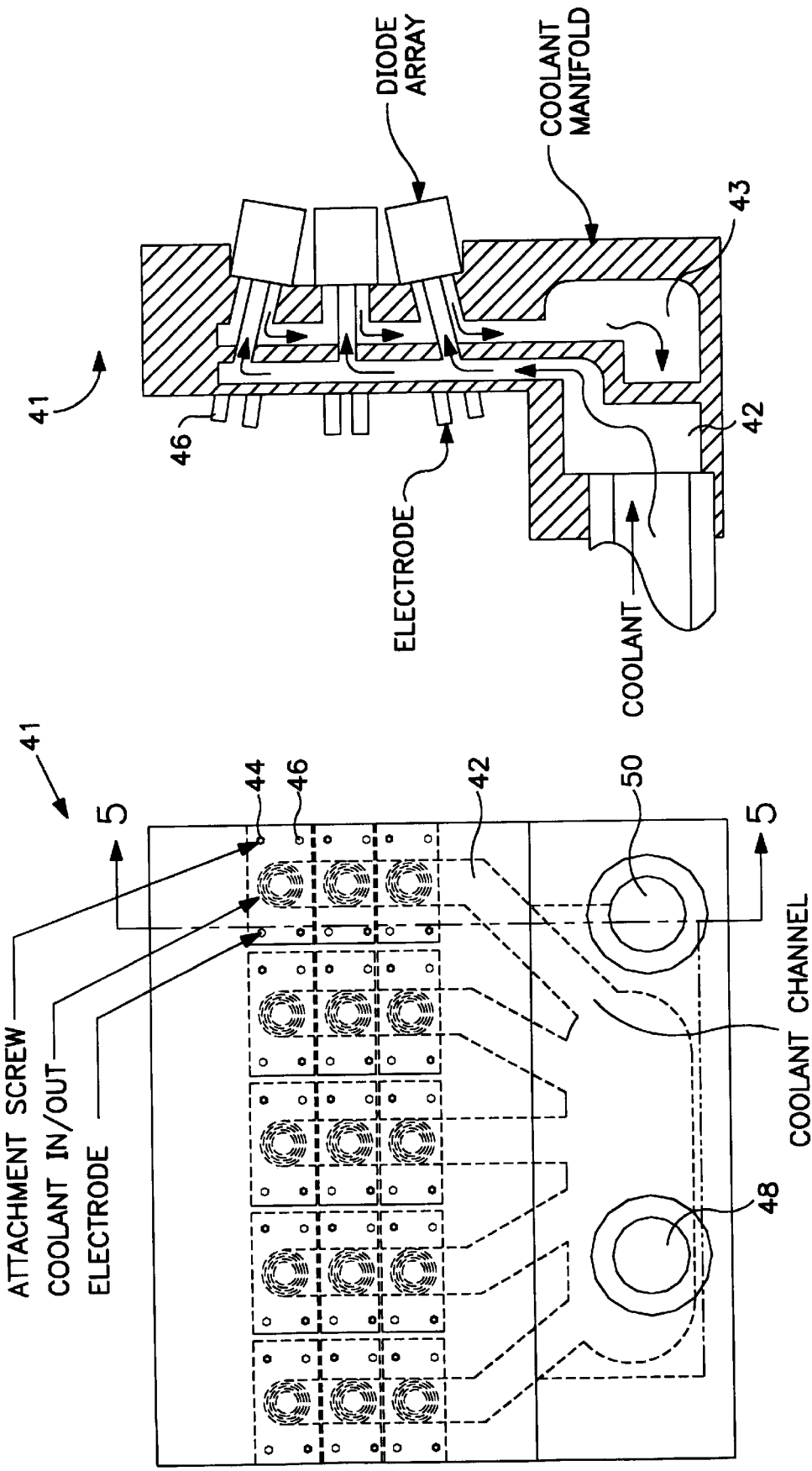
FIG. 5 is a plan view of a manifold assembly in accordance with the present invention.
FIG. 6 is a sectional view of the manifold assembly of FIG. 5 along line 6—6.

As shown, the diode arrays 24 and 30 are linearly disposed adjacent the opposing pumping surfaces 38 and 40 and generally aligned adjacent a mid-section of the crystal 20, and disposed to be generally parallel to the transverse axis 36. The diode arrays 22 and 26, as well as the diode arrays 28 and 32, are non-linearly disposed at predetermined angles relative to the major axis 34. These angles are determined to cause an average energy deposition in the lasing material. As shown, the diode array 22, as well as the diode array 32, are generally configured to be parallel to one another, while the diode arrays 26 and 28 are also parallel to one another. An exemplary angle for the configuration illustrated in FIG. 3 is 11°. The diode arrays 22, 24, 26, 28, 30 and 32 are configured by way of a manifold assembly 41 (FIGS. 5 and 6). The manifold assembly 41 allows the diode arrays 22, 24, 26, 28, 30 and 32 to be positioned as discussed above as well as distribute coolant to the diode arrays 22, 24, 26, 28, 30 and 32. The manifold assembly 41 for the diode arrays is illustrated in FIGS. 4–6.

Figure 3:
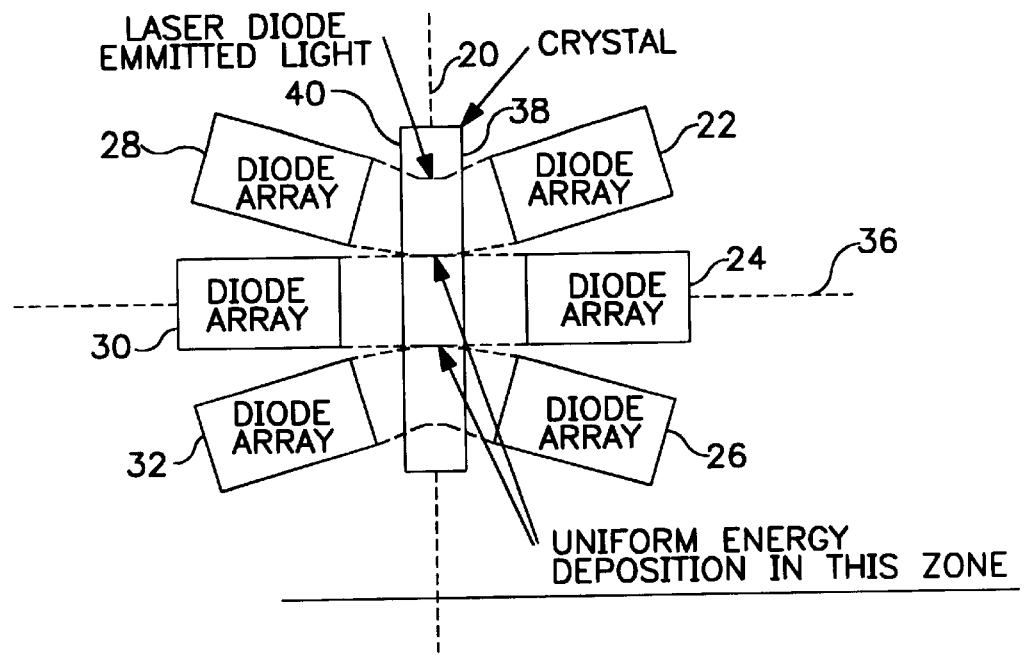
FIG. 3 is an illustration of an optical amplifier for a solid state laser in accordance with the present invention.
Figure 4:
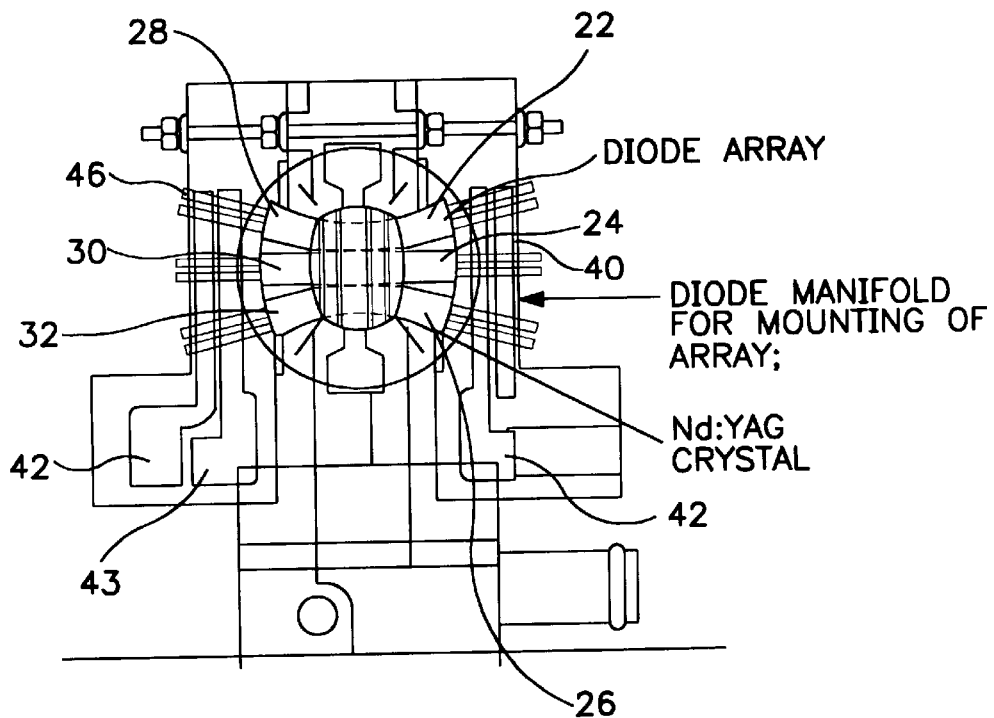
FIG. 4 is a plan view of a diode array carried by a manifold assembly in accordance with the present invention.

The manifold assembly 41 is configured to carry the diode arrays 22, 24, 26, 28, 30 and 32 as generally illustrated in FIG. 3. The diode arrays 22, 24, 26, 28, 30 and 32 are mounted to the manifold assembly 41 by way of a plurality of attachments screws 44. Electrical connection to the diode arrays 22, 24, 26, 28, 30 and 32 are by way of plurality of electrodes. The manifold assembly 41 includes a plurality of inlet cooling channels 42 as well as a plurality of outlet cooling channels 43 as shown. The diode arrays 22, 24, 26, 28, 30 and 32 are mounted to the surface of the manifold assembly 41 as shown best in FIGS. 5 and 6. The inlet and outlet cooling channels 42 and 43 are concentrically disposed adjacent the mounting surface for the diode arrays. Inlet and outlet nozzles 48 and 50, respectively are provided for connection to an external cooling supply and discharge reservoir (not shown).

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A solid state optical amplifier comprising:
   an elongated portion of a predetermined lasing material formed in a predetermined geometry, defining a longitudinal axis and a pair of pumping surfaces;
   a plurality of diode arrays for providing energy to said lasing material in order to excite the lasing material to a relatively high energy metastable state, said diode arrays configured such that at least one of said plurality of diode arrays is disposed at a non-perpendicular angle relative to said longitudinal axis to provide relatively uniform energy deposition in said lasing material along said pair of pumping surfaces, wherein said plurality of diode arrays also includes one or more pairs of diode arrays linearly disposed relative to an axis parallel to said longitudinal axis at an angle generally perpendicular to said longitudinal axis.

2. The solid state optical amplifier as recited in claim 1, wherein said solid state lasing material is a yttrium-aluminum-garnet (YAG) crystal.

3. The solid state optical amplifier as recited in claim 1, wherein said elongated portion of said lasing material is configured as a generally elongated slab having a generally rectangular cross-section defining intermediate opposing end faces of said slab.

4. The solid state optical amplifier as recited in claim 1, wherein one or more of said diode arrays are non-linearly disposed relative to an axis parallel to said longitudinal axis at a first predetermined angle relative to a transverse axis, said transverse axis being generally perpendicular to said longitudinal axis.

5. The solid state optical amplifier as recited in claim 4, wherein one or more of said diode arrays are disposed at a second, different predetermined angle relative to said transverse axis.

6. The solid state optical amplifier as recited in claim 1, wherein said plurality of diode arrays includes at least one first pair of diode arrays, wherein each diode in said first pair of diode arrays is linearly disposed adjacent opposing pumping surfaces of said lasing material.

7. The solid state optical amplifier as recited in claim 6, wherein said plurality of diode arrays includes at least one second pair of diode arrays, wherein said second pair of diode arrays are disposed at one or more angles relative to said transverse axis.

8. A solid state optical amplifier comprising:
   an elongated slab of lasing material defining a longitudinal axis and a transverse axis, said elongated slab having a generally rectangular cross-section, said slab formed with opposing sidewall surfaces defining pumping surfaces generally parallel to said longitudinal axis;

one or more first pairs of diode arrays, each diode array in said one or more first pair of diode arrays being disposed along axes generally perpendicular to said longitudinal axis and disposed adjacent pumping surfaces of said elongated slab; and one or more second pairs of diode arrays, each diode array in said one or more second pairs of diode arrays being disposed adjacent said pumping surfaces of said elongated slab at one or more predetermined angles relative to said transverse axis of said elongated slab, said one or more first pairs and said one or more second pairs of diode arrays being configured to provide a predetermined energy distribution along said pumping surfaces.

9. The solid state optical amplifier as recited in claim 8, wherein said predetermined lasing material is yttrium-aluminum-garnet (YAG) crystal.

10. The solid state optical amplifier as recited in claim 8, wherein said predetermined energy distribution is uniform.

* * * * *